(12) United States Patent

He et al.

(10) Patent No.: US 7,462,217 B2
(45) Date of Patent: Dec. 9, 2008

(54) METHOD OF PREPARATION FOR THE HIGH PERFORMANCE THERMOELECTRIC MATERIAL INDIUM-COBALT-ANTIMONY

(75) Inventors: Tao He, Wilmington, DE (US); James J. Krajewski, Somerville, NJ (US); Munirpallam Appadorai Subramanian, Kennett Square, PA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 657 days.

(21) Appl. No.: 10/911,007

(22) Filed: Aug. 4, 2004

(65) Prior Publication Data

US 2005/0123431 A1    Jun. 9, 2005

Related U.S. Application Data

(60) Provisional application No. 60/527,791, filed on Dec. 8, 2003.

(51) Int. Cl.
C22C 12/00 (2006.01)
B22F 3/00 (2006.01)
H01L 35/18 (2006.01)

(52) U.S. Cl. .............................. 75/228; 419/31; 419/33; 419/38; 419/57; 136/205; 136/236.1; 136/240

(58) Field of Classification Search .................. 75/228; 419/33, 55, 31, 38, 57; 136/205, 236.1, 240
See application file for complete search history.

(56) References Cited

U.S. PATENT DOCUMENTS

| | | | |
|---|---|---|---|
| 5,064,476 A | 11/1991 | Recine | |
| 5,171,372 A | 12/1992 | Recine | |
| 5,441,576 A | 8/1995 | Bierschenk | |
| 5,576,512 A | 11/1996 | Doke | |
| 5,610,366 A | 3/1997 | Fleurial | |
| 5,747,728 A | 5/1998 | Fleurial | |
| 5,769,943 A | 6/1998 | Fleurial | |
| 5,929,351 A * | 7/1999 | Kusakabe et al. | ............. 75/228 |
| 5,965,841 A * | 10/1999 | Imanishi et al. | ............. 136/240 |
| 6,188,011 B1 | 2/2001 | Nolas | |
| 6,207,886 B1 | 3/2001 | Kusakabe et al. | |
| 6,207,888 B1 | 3/2001 | Nolas | |
| 6,225,550 B1 | 5/2001 | Hornbostel et al. | |
| 6,342,668 B1 | 1/2002 | Fleurial | |
| 6,369,314 B1 * | 4/2002 | Nolas | ......................... 136/201 |
| 2003/0168641 A1 | 9/2003 | Funahashi et al. | |
| 2005/0121066 A1 | 6/2005 | He | |
| 2005/0229963 A1 | 10/2005 | He | |

FOREIGN PATENT DOCUMENTS

| | | |
|---|---|---|
| EP | 0 948 061 A2 | 10/1999 |
| JP | 57-179023 | 11/1982 |
| JP | 4-62981 A1 | 2/1992 |
| JP | 08057290 A | 3/1996 |
| JP | 2001-102642 A | 4/2001 |
| JP | 2002-26400 A | 1/2002 |

OTHER PUBLICATIONS

Koji Akai et. al., Effects of Defects and Impurities on Electronic Properties in CoSB3, 16$^{TH}$ International Conference on Thermoelectrics, 1997, pp. 334-337.
Koji Akai et. al., Effects of Defects and Impurities on Electronic Properties in Skutterudites, 17$^{TH}$ International Conference on Thermoelectrics, 1996, pp. 105-108.
B.C. Sales et al., Filled Skutterudite Antimonides: A New Class of Thermoelectric Materials, Science, 1996, pp. 1325-1328, vol. 272.
Brian C. Sales, Novel Thermoelectric Materials, Current Opinion On Solid State & Materials Science, 1997, pp. 2:284-289.
Kojiakai et al., Effects of Defects and Impurities on Electronic Properties in CoSb3, 16th International Conference on Thermoelectrics, 1997, pp. 334-337.
D.M. Rowe et al., Thermoelectric Properties of Hot-Pressed YbA13 Compound Over Temperature Range 150-800K, 16th International Conference on Thermolectrics, 1997, pp. 528-531.
Kojiakai et al., Effectsof Defects and Impuriteies on Electronic Properties in Skutterudites, 17th International Conference on Thermoelectrics, 1998, pp. 105-108.
Lidong Chen, Recent Advances in Filled Skutterudite Systems, 21st International Conference on Thermoelectronics, 2002, pp. 42-47.
Ctirad Uher, in Search of Efficient N-Type Skutterudite Thermoelectronics, 21st International Conference on Thermoelectronics, 2002, pp. 35-41.
Jeffrey S. Dyck et al., Thermoelectric Properties of the N-Type Filled Skutterudite Ba 0.3 Co4 Sb12 Doped with Ni, Journal of Applied Physics, 2002, pp. 3698-3705, vol. 91.
Y.J. Kuo et al., Thermoelectric Properties of Binary Cd-Yb Quasicrystals and Cd6-Yb, Journal of Applied Physics, 2004, pp. 1900-1905, vol. 95, No. 4.
T. He et al., Origin of Low Thermal Conductivity in a-Mn: Enhancing the ZT of YbA13 and CoSb3, Through Mn Addition, 2005, International Conference on Thermoelectrics, 2005, pp. 437-442.

* cited by examiner

*Primary Examiner*—Roy King
*Assistant Examiner*—Ngoclan T Mai

(57) ABSTRACT

The present invention relates to a process for the preparation of thermoelectric compositions of the formula $In_xCO_4Sb_{12}$ ($0<x<1$), with a figure of merit greater than 1.0 and a composition made by that process.

5 Claims, 2 Drawing Sheets

The measured Seebeck coefficient in the temperature range of 300 – 600 K.

The measured electrical resistivity in the temperature range of 300-600 K

The measured thermal conductivity in the temperature range of 300 – 600 K

The calculated figure of merit ZT in the temperature range of 300 – 600 K.

METHOD OF PREPARATION FOR THE HIGH PERFORMANCE THERMOELECTRIC MATERIAL INDIUM-COBALT-ANTIMONY

CROSS REFERENCE TO RELATED APPLICATIONS

This application claims the benefit of U.S. Provisional Application No. 60/527,791, filed on Aug. 12, 2003.

FIELD OF THE INVENTION

The present invention relates to a process for the preparation of thermoelectric compositions of the formula $In_xCO_4Sb_{12}$ (0<x<1), with a Figure of Merit greater than 0.2.

TECHNICAL BACKGROUND

Thermoelectric materials are used in the manufacture of such items as refrigerators, heaters and generators. It is desirable for these thermoelectric materials to have large Seebeck coefficients, as defined herein below, and have high electrical conductivity but low thermal conductivity. The performance of thermoelectric conversion materials is expressed as "Figure of Merit (ZT)". At present, the best thermoelectric materials have ZT values of about 1.0.

Akai et al, Proceedings of the $17^{th}$ International Conference on Thermoelectrics, 1998, 105-108 characterize Indium-doped Cobalt Antimonide produced by a solid phase reaction followed by hot-pressing.

In contrast, the process of the present invention uses firing of mixed powder in 1 to 15% hydrogen and 85 to 99% argon followed by a furnace cool. The calcined powder is then reground and pressed into disks which are then sintered at 675° C. for 4 hours in the same hydrogen/argon mixture. This procedure can result in material with a ZT greater than 1.0.

SUMMARY OF THE INVENTION

The present invention is a process comprising:

a) mixing powders of indium, cobalt and antimony to form a mixture of powders such that there is 0.006 to 0.030 atomic percent indium, 0.242 to 0.248 atomic percent cobalt and 0.727 to 0.745 atomic percent antimony in said mixture of powders b) flowing a gas composition through a furnace containing said mixture of powders, said gas composition comprising of 1 to 15 atomic percent hydrogen and 85 to 99 atomic percent argon c) heating said furnace at approximately 1 to 5 C/minute from room temperature to from 590° C. to 620° C. and holding said furnace at 590° C. to 620° C. for between ten and fourteen hours d) further heating said furnace to between 665° C. to 685° C. at approximately 1 to 5 C/minute and holding said furnace at 665° C. to 685° C. for between 30 to 40 hours to form a first solid e) grinding said first solid to form a second powder f) pressing said second powder into a second solid g) flowing a gas composition through said furnace containing said second solid, said gas composition comprising of 1 to 15 atomic percent hydrogen and 85 to 99 atomic percent argon h) heating said furnace at approximately 1 to 5 C/minute from room temperature to between 665° C. to 685° C. and holding said furnace at between 665° C. to 685° C. for between 1 to 8 hours.

The present invention is also a composition made by the above-described process.

The present invention is further a composition with a figure of merit, ZT, greater than 0.7.

The present invention is yet further a refrigerator, heater or generator comprising the above described compositions.

DETAILED DESCRIPTION OF THE INVENTION

Figure 1:
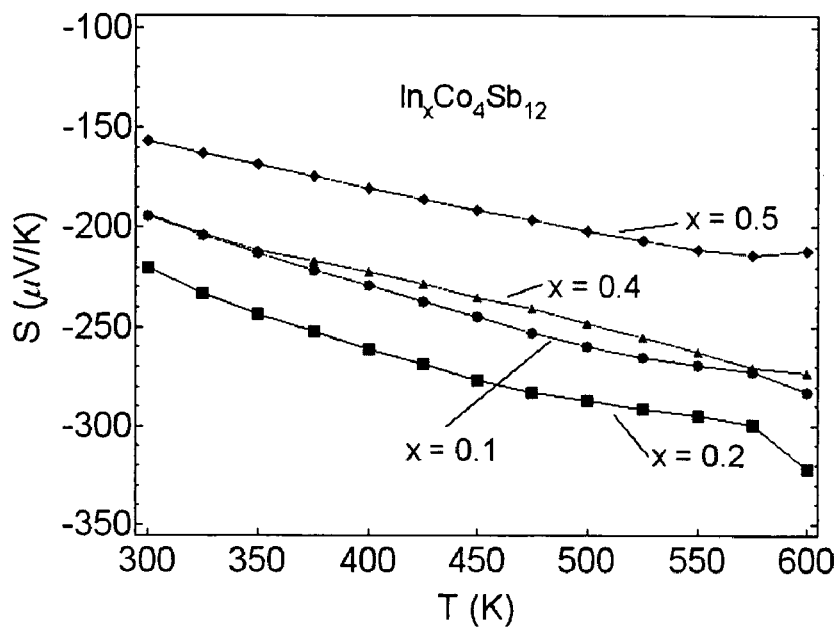
FIG. 1 shows the measured Seebeck Coefficient in the temperature range of 300-600 K for various Indium concentration levels.

This invention provides a method of preparing intermetallic thermoelectric compositions of the formula $In_xCO_4Sb_{12}$ (0<x<1). These compounds have a lower electrical resistivity, lower thermal conductivity and higher Seebeck coefficient than $CoSb_3$ in the temperature range 300 K-600 K. This results in an improvement in the figure of merit from 0.2 (x=0) to 1.2 (x=0.2) at 600 K.

Thermoelectrics is the science and technology associated with thermoelectric converters, that is, the generation of electric power by the Seebeck effect and refrigeration by the Peltier effect. The performance of thermoelectric conversion materials is evaluated by ZT(Figure of Merit), which is expressed by the following equation:

$$ZT = \sigma S^2 T/\kappa$$

Where $\sigma$, $S$, $\kappa$, and $T$ are the electrical conductivity, Seebeck coefficient, thermal conductivity and absolute temperature, respectively. Materials with large Seebeck coefficient, high electrical conductivity but low thermal conductivity are needed.

At present, the best thermoelectric materials have ZT values close to 1, such as alloys of $Bi_2Te_3$. They operate with poor Carnot efficiency of about 10% when compared to compressor based refrigerators. In a semiconductor structure that conducts heat poorly, such as glass, but conducts electrons (or holes) relatively well like silicon, one can dramatically improve thermoelectric efficiency by reducing theremal conductivity. The reduction of the thermal conductivity can be achieved by preparing ternary or quaternary semiconductors in which one or more of the atoms are weakly bound in oversized "atomic cages". The "rattling motion" of the caged atoms effectively scatters heat-carrying phonons and markedly reduces the lattice contribution to the thermal conductivity; yet at the same time, the framework atoms maintain good electrical conduction. An example of such structures is the Skutterudites, which have emerged as one of the most promising new thermoelectric materials for power generation applications.

The compositions of this invention can be synthesized by the following procedure. High purity powders of Co, Sb, and In are mixed thoroughly in stoichiometric ratio. The mixed powder of starting materials is put into an alumina crucible, which is in turn put into an alumina boat. Another crucible containing pure Sb metal is also put into the boat to compensate for the evaporation of Sb. The boat is then inserted into a quartz reactor with the Sb containing crucible facing the gas inlet. The powder is calcined at about 610° C. for 12 hours, and then 675° C. for 36 hours under a gas mixture of 5% $H_2$ and 95% Ar. The calcined powder is reground and pressed to 12.8 mm diameter/1-2 mm thick disks. The disks are sintered at 675° C. for 4 hours under the same gas mixture. In both the calcining and sintering steps, the heating rate is about 240° C./hour from room temperature to the calcining or sintering temperature. After the desired reaction time, the samples are furnace cooled to room temperature. Powder X-ray diffraction data showed all the $In_xCO_4Sb_{12}$ (0<x<1) phases of this invention crystallize in a cubic Im-3 structure.

The electrical resistivity is measured from 300K to 600 K by the Van Der Pauw technique using a commercial apparatus by MMR Technologies of Mountainview, Calif. following manufacturers procedure. Silver paint is used to attach the leads to the pellet. The Seebeck coefficient is measured in the same temperature range. The pellet is placed between silver electrodes which are electrically isolated from each other. One electrode is heated by a resistive heater to develop a thermal gradient across the sample, which varies from 5 to 10 degrees Kelvin at each temperature set point. The testing assemble is placed in a temperature controlled oven under Ar. The voltage developed is measured with a Keithley 181 nanovoltmeter manufactured by Keithley Instruments of Cleveland, Ohio. The measured Seebeck coefficient is negative indicating n-type conduction. The thermal conductivity were determined in Netzsch Laser Microflash with reference material of 1-mm or 2-mm gold-sputtered, graphite-coated Pyrex glass. This instrument is manufactured by Netzsch Instruments Inc. of Burlington, Mass.

Thermoelectric materials such as n-type $In_xCO_4Sb_{12}$ (0<x<1) can be used to manufacture thermoelectric refrigerators, heaters or generators in conjunction with p-type thermoelectric materials such as $CeFe_3CoSb_{12}$ or $LaFe_3CoSb_{12}$. In a thermoelectric refrigerator, the thermoelectric material is typically mounted between two plates of materials such as ceramics. One plate is located at the region to be cooled. The other plate is located where the heat is to be rejected. Current of the appropriate polarity is passed through the thermoelectric material, cooling the desired location. If the polarity of the current is reversed, the previously cooled plate will be heated and the plate rejecting the heat will be cooled. To use thermoelectric devices as generators, the thermoelectric material is again mounted between two plates. One plate is exposed to a high temperature source while the second plate is maintained at a lower temperature. Electrical power can be obtained from electrical connections across the sides of the thermoelectric material in the temperature gradient.

EXAMPLES

Examples 1-7

The compositions of $In_xCO_4Sb_{12}$ of Examples 1-7 wherein were made using the following procedure. For each Example, appropriate amounts of the starting metals In, Co and Sb were weighed according to the stoichiometric ratios and mixed thoroughly in an agate mortar. The gram amounts for a 2-gram sample size of the starting materials used are shown in Table 1.

TABLE 1

| Ex | Composition | Indium metal (gram) | Cobalt metal (gram) | Antimony metal (gram) |
|---|---|---|---|---|
| 1 | $CoSb_3$ | — | 0.2779 | 1.7221 |
| 2 | $In_{0.03}Co_4Sb_{12}$ | 0.0041 | 0.2773 | 1.7186 |
| 3 | $In_{0.075}Co_4Sb_{12}$ | 0.0101 | 0.2765 | 1.7134 |
| 4 | $In_{0.1}Co_4Sb_{12}$ | 0.0134 | 0.2760 | 1.7106 |
| 5 | $In_{0.2}Co_4Sb_{12}$ | 0.0267 | 0.2742 | 1.6991 |
| 6 | $In_{0.4}Co_4Sb_{12}$ | 0.0527 | 0.2705 | 1.6768 |
| 7 | $In_{0.5}Co_4Sb_{12}$ | 0.0655 | 0.2688 | 1.6658 |

In each Example, the mixed powder was fired at about 610° C. for 12 hours, and then 675° C. for 36 hours under a gas mixture of 5% $H_2$ and 95% Ar and furnace cooled to room temperature. The calcined powder was reground and pressed to 12.8 mm diameter/1-2 mm thick disks. The disks were sintered at 675° C. for 4 hours under the same gas mixture and used for thermal conductivity measurements. Bars of about 1.5×1.5×7 $mm^3$ size were cut for resistivity and Seebeck coefficient measurements.

Figure 2:
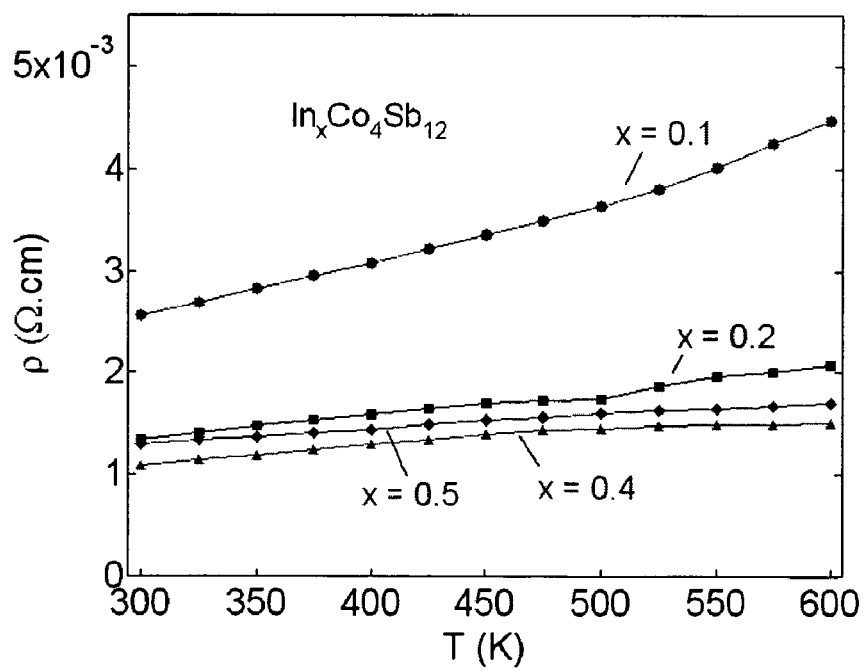
FIG. 2 shows the measured electrical resistivity in the temperature range 300-600 K for various Indium concentration levels.
Figure 3:
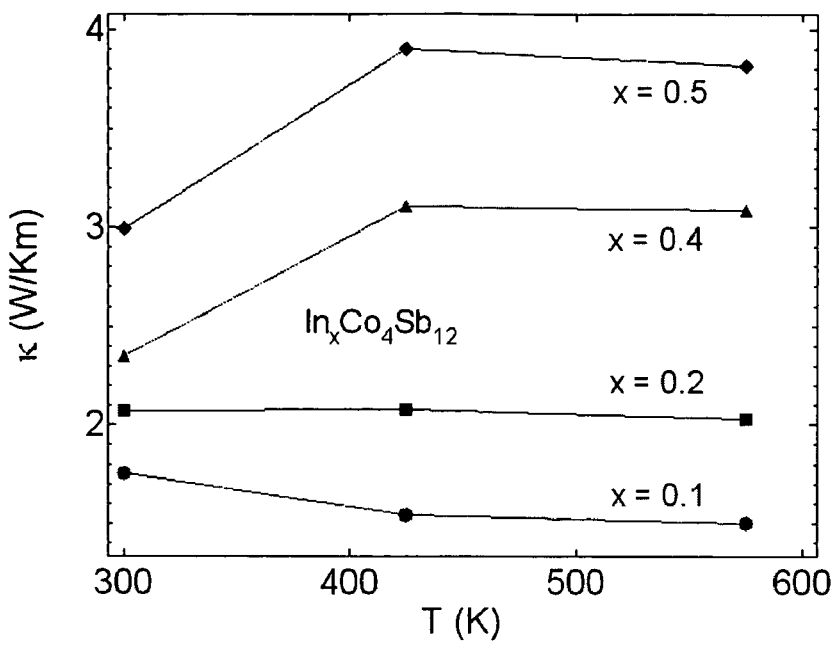
FIG. 3 shows the measured thermal conductivity in the temperature range 300-600 K for various Indium concentration levels.
Figure 4:
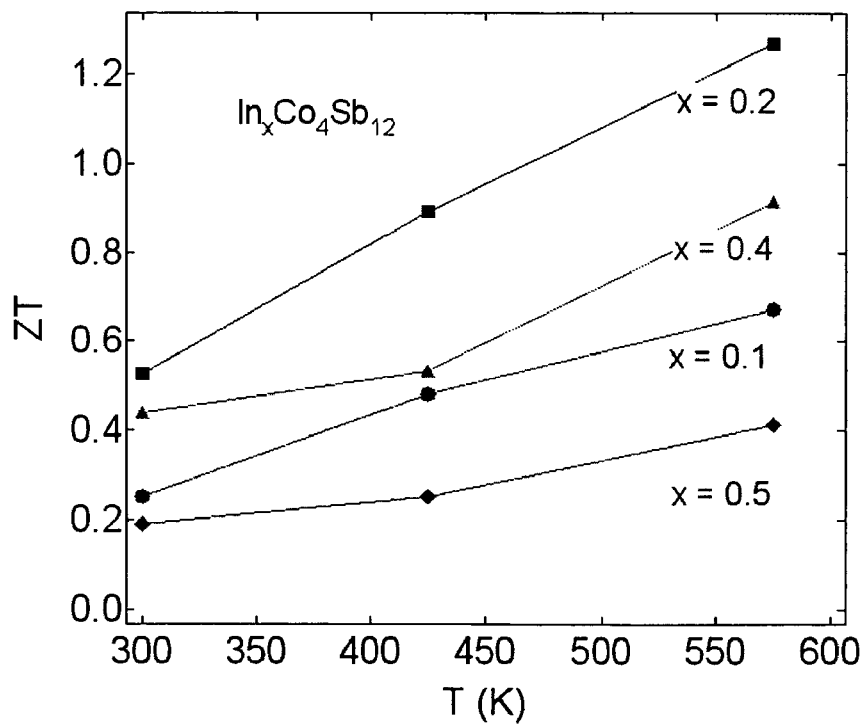
FIG. 4 shows the calculated figure of merit in the temperature range 300-600 K for various Indium concentration levels.

X-ray powder diffraction patterns were recorded and the data showed all samples crystallized in a cubic Im-3 structure. The measured Seebeck coefficients, electrical resistivities and thermal conductivities in the temperature range of 300-600 K are shown in FIGS. 1, 2 and 3 respectively. The calculated ZT values are given in FIG. 4.

What is claimed is:

1. A process comprising:
   a) mixing powders of indium, cobalt and antimony to form a mixture of powders such that there is 0.006 to 0.030 atomic percent indium, 0.242 to 0.248 atomic percent cobalt and 0.727 to 0.745 atomic percent antimony in said mixture of powders;
   b) flowing a gas composition through a furnace containing said mixture of powders, said gas composition comprising 1 to 15 atomic percent hydrogen and 85 to 99 atomic percent argon;
   c) heating said furnace at a rate of approximately 1 to 5° C/minute from room temperature to a temperature in the range of from 590° C. to 620° C., and holding said furnace at a temperature in the range of from 590° C. to 620° C. for a period of time between ten and fourteen hours;
   d) further heating said furnace to a temperature between 665° C. to 685° C. at a rate of approximately 1 to 5 C/minute, and holding said furnace at a temperature between 665° C. to 685° C. for a period of time between 30 to 40 hours to form a first solid;
   e) grinding said first solid to form a second powder;
   f) pressing said second powder into a second solid;
   g) flowing a gas composition through a furnace containing said second solid, said gas composition comprising 1 to 15 atomic percent hydrogen and 85 to 99 atomic percent argon; and
   h) heating said furnace at a rate of approximately 1 to 5° C/minute from room temperature to a temperature between 665° C. to 685° C., and holding said furnace at a temperature between 665° C. to 685° C. for a period of time between 1 to 8 hours.

2. A composition comprising
$In_xCO_4Sb_{12}$ (0<x<1) with a figure of merit, ZT, greater than 0.7.

3. A thermoelectric refrigerator comprising a component made from the composition of claim 2.

4. A thermoelectric generator comprising a component made from the composition of claim 2.

5. A thermoelectric heater comprising a component made from the composition of claim 2.

* * * * *